US012687770B2

(12) United States Patent
Dai et al.

(10) Patent No.: US 12,687,770 B2
(45) Date of Patent: Jul. 21, 2026

(54) PROJECTION DEVICE

(71) Applicant: Coretronic Corporation, Hsin-Chu (TW)

(72) Inventors: Jia-Hong Dai, Hsin-Chu (TW); Wei-Chi Liu, Hsin-Chu (TW)

(73) Assignee: Coretronic Corporation, Hsin-Chu (TW)

( * ) Notice: Subject to any disclaimer, the term of this patent is extended or adjusted under 35 U.S.C. 154(b) by 703 days.

(21) Appl. No.: 17/890,294

(22) Filed: Aug. 18, 2022

(65) Prior Publication Data

US 2023/0057909 A1 Feb. 23, 2023

(30) Foreign Application Priority Data

Aug. 20, 2021 (CN) .......................... 202110958332.0

(51) Int. Cl.
G03B 21/16 (2006.01)
H05K 7/20 (2006.01)

(52) U.S. Cl.
CPC ......... G03B 21/16 (2013.01); H05K 7/20154 (2013.01); H05K 7/2039 (2013.01)

(58) Field of Classification Search
CPC ... G03B 21/16; H05K 7/20154; H05K 7/2039
USPC ........................................................ 353/61
See application file for complete search history.

(56) References Cited

U.S. PATENT DOCUMENTS

| | | | | | |
|---|---|---|---|---|---|
| 11,156,906 B2 * | 10/2021 | Wu | ......................... | G03B 21/16 |
| 2020/0386490 A1 * | 12/2020 | Huang | ...................... | F28F 1/32 |

FOREIGN PATENT DOCUMENTS

| | | | | | |
|---|---|---|---|---|---|
| CN | 2613625 | Y | 4/2004 | | |
| CN | 106547329 | A | 3/2017 | | |
| CN | 106912180 | A | 6/2017 | | |
| CN | 110780520 | A * | 2/2020 | ............. | G03B 21/16 |
| CN | 111255719 | A | 6/2020 | | |
| CN | 111610685 | A | 9/2020 | | |
| CN | 112068388 | A | 12/2020 | | |
| JP | 2003075081 | A * | 3/2003 | | |
| JP | 3096950 | U * | 1/2004 | | |
| TW | M486786 | U | 9/2014 | | |

OTHER PUBLICATIONS

Translation of CN_110780520_A (Year: 2025).*
(Continued)

*Primary Examiner* — Jerry L Brooks

(57) ABSTRACT

A projection device includes a heat source and a heat dissipation module, including a heat dissipation base, a heat dissipation fin set, at least one heat conductor, a first fan and a second fan. The heat dissipation fin set has first and second regions adjacent to each other. The first region is located between the heat dissipation base and the second region. The first region has two opposite first ventilation surfaces. The second region has two opposite second ventilation surfaces. There is an angle between a normal direction of the first ventilation surface and a normal direction of the second ventilation surface. The heat conductor is connected between the heat dissipation base and the heat dissipation fin set. The first fan generates a first airflow flowing through the first ventilation surfaces. The second fan generates a second airflow flowing through the second ventilation surfaces.

12 Claims, 10 Drawing Sheets

(56)  References Cited

OTHER PUBLICATIONS

Translation of JP_2003075081_A (Year: 2025).*
Translation of JP_3096950_U (Year: 2025).*
The first Office Action, dated May 23, 2025, in counterpart China Application No. 202110958332.0.

* cited by examiner

10

V2

160

I2

150

O2

F2

S3

100

N1

S1

N2

110

F2

S4

F

130

120

122

121

140

X

Z

Y

10b

G2    V2    160

150

100b

G1

S3    S1

110

S4    122    140    121

130

120

X

Z

Y

PROJECTION DEVICE

CROSS-REFERENCE TO RELATED APPLICATION

This application claims the priority benefit of China application (202110958332.0), filed on Aug. 20, 2021. The entirety of the above-mentioned patent application is hereby incorporated by reference herein and made a part of this specification.

FIELD OF THE INVENTION

The invention relates to a display device, and more particularly to a projection device.

BACKGROUND OF THE INVENTION

The types of light sources used in projection devices have evolved from UHP lamps, light emitting diodes (LEDs) to laser diodes (LDs) as the market demands brightness, color saturation, long lifespan, and non-toxic environmental protection for projection devices. In addition, the light valves used in projection devices are, for example, reflective liquid crystal on silicon (LCOS), digital micro-mirror device (DMD), or transparent liquid crystal panel (TLP).

A heat source includes the light source or light valve, and the light source or light valve may generate a lot of heat during operation. Thus, the projection device is usually equipped with heat dissipation fins and fans to dissipate heat from the heat source. As the demand for high brightness increases, the heat generated by the heat source also increases, which makes the existing heat dissipation fins and fans unable to provide sufficient heat dissipation. In addition, due to the limited internal space of the projection device, large-size heat dissipation fins and fans cannot be directly used to improve the heat dissipation effect. In order to solve this problem, it is often necessary to change the design of the housing of the projection device and some mechanical components, which leads to an increase in product development costs.

The information disclosed in this "BACKGROUND OF THE INVENTION" section is only for enhancement understanding of the background of the invention and therefore it may contain information that does not form the prior art that is already known to a person of ordinary skill in the art. Furthermore, the information disclosed in this "BACKGROUND OF THE INVENTION" section does not mean that one or more problems to be solved by one or more embodiments of the invention were acknowledged by a person of ordinary skill in the art.

SUMMARY OF THE INVENTION

The invention provides a projection device to enhance heat dissipation efficiency and reduce development costs.

Other advantages and objects of the invention may be further illustrated by the technical features broadly embodied and described as follows.

In order to achieve one or a portion of or all of the objects or other objects, an embodiment of the invention provides a projection device, which includes a heat source and a heat dissipation module. The heat dissipation module includes a heat dissipation base, a heat dissipation fin set, at least one heat conductor, a first fan and a second fan. The heat dissipation base is in contact with the heat source. The heat dissipation fin set has a first region and a second region adjacent to each other. The first region is located between the heat dissipation base and the second region. The first region has two opposite first ventilation surfaces. The second region has two opposite second ventilation surfaces. There is an angle between a normal direction of each of the first ventilation surfaces and a normal direction of each of the second ventilation surfaces. The at least one heat conductor is connected between the heat dissipation region and the heat dissipation fin set. The first fan is configured to generate a first airflow flowing through each of the first ventilation surfaces. The second fan is configured to generate a second airflow flowing through each of the second ventilation surfaces.

In the projection device of the invention, the heat dissipation module uses two fans (i.e., the first fan and the second fan) provided at different locations to dissipate heat from the heat dissipation fin set, so that the projection device of the invention can have better heat dissipation efficiency, compared to the prior art. In addition, compared to the prior art, the additional fan (e.g., the second fan) of the heat dissipation module of the invention can be provided in the existing unused space inside the projection device, so the projection device of the invention does not require structural changes, thus reducing development costs.

Other objectives, features and advantages of The invention will be further understood from the further technological features disclosed by the embodiments of The invention wherein there are shown and described preferred embodiments of this invention, simply by way of illustration of modes best suited to carry out the invention.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION OF PREFERRED EMBODIMENTS

In the following detailed description of the preferred embodiments, reference is made to the accompanying drawings which form a part hereof, and in which is shown by way of illustration specific embodiments in which the invention may be practiced. In this regard, directional terminology, such as "top", "bottom", "front", "back", etc., is used with reference to the orientation of the Figure(s) being described. The components of the invention can be positioned in a number of different orientations. As such, the directional terminology is used for purposes of illustration and is in no way limiting. On the other hand, the drawings are only schematic and the sizes of components may be exaggerated for clarity. It is to be understood that other embodiments may be utilized and structural changes may be made without departing from the scope of the invention. Also, it is to be understood that the phraseology and terminology used herein are for the purpose of description and should not be regarded as limiting. The use of "including", "comprising", or "having" and variations thereof herein is meant to encompass the items listed thereafter and equivalents thereof as well as additional items. Unless limited otherwise, the terms "connected", "coupled", and "mounted" and variations thereof herein are used broadly and encompass direct and indirect connections, couplings, and mountings. Similarly, the terms "facing", "faces", and variations thereof herein are used broadly and encompass direct and indirect facing, and "adjacent to" and variations thereof herein are used broadly and encompass directly and indirectly "adjacent to". Therefore, the description of "A" component facing "B" component herein may contain the situations that "A" component facing "B" component directly or one or more additional components is between "A" component and "B" component. Also, the description of "A" component "adjacent to" "B" component herein may contain the situations that "A" component is directly "adjacent to" "B" component or one or more additional components is between "A" component and "B" component. Accordingly, the drawings and descriptions will be regarded as illustrative in nature and not as restrictive.

Figure 1:
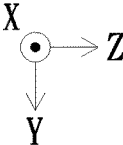
FIG. 1 is a schematic view of a heat dissipation module of a projection device according to an embodiment of the invention.
Figure 2:
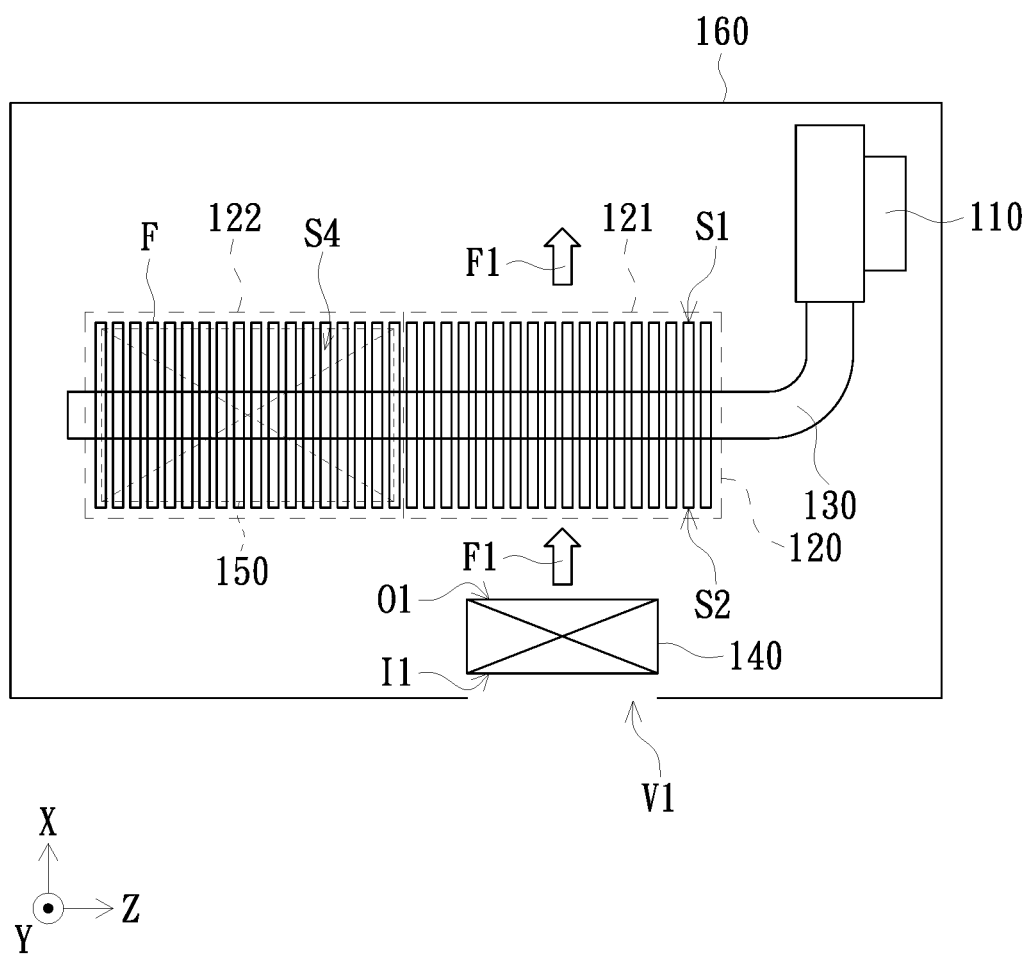
FIG. 2 is a schematic view of the heat dissipation module of the projection device of FIG. 1 from another perspective.

FIG. 1 is a schematic view of a heat dissipation module of a projection device according to an embodiment of the invention. FIG. 2 is a schematic view of the heat dissipation module of the projection device of FIG. 1 from another perspective. Referring to FIGS. 1 and 2, the projection device 10 includes a heat source (not shown) and a heat dissipation module 100. The heat source includes a light source or a light valve. The heat dissipation module 100 is in direct contact with the heat source. The heat dissipation module 100 includes a heat dissipation base 110, a heat dissipation fin set 120, at least one heat conductor 130, a first fan 140, and a second fan 150. In this embodiment, the number of the aforementioned at least one heat conductor 130 is, for example, plural, and FIG. 1 shows four heat conductors 130 as an example. The heat dissipation fin set 120 has a first region 121 and a second region 122 adjacent to each other, wherein the first region 121 is located between the heat dissipation base 110 and the second region 122. The first region 121 has two first ventilation surfaces S1 and S2 opposite to each other (the first ventilation surface S2 is shown in FIG. 2). The second region 122 has two second ventilation surfaces S3 and S4 opposite to each other. There is an angle between the normal direction of the first ventilation surface S1 and S2 and the normal direction of the second ventilation surface S3 and S4. For example, the angle between the normal direction N1 of the first ventilation surface S1 and the normal direction N2 of the second ventilation surface S3 may be between 85 and 95 degrees. Further, the normal direction N1 may be substantially parallel to direction X, and the normal direction N2 may be substantially parallel to direction Y. In this embodiment, the angle between the normal directions N1 and N2 is about 90 degrees, but the invention is not limited thereto. The direction X is opposite to the direction of gravity. In this embodiment, the heat conductors 130 are connected between the heat dissipation base 110 and the heat dissipation fin set 120. The first fan 140 is configured to generate a first airflow F1 (shown in FIG. 2) flowing through the first ventilation surfaces S1 and S2, and the second fan 150 is configured to generate a second airflow F2 (shown in FIG. 1) flowing through the second ventilation surfaces S3 and S4, wherein the direction of the first airflow F1 is perpendicular to the direction of the second airflow F2.

The aforementioned heat source includes a light source or a light valve. The light source may include an ultra-high pressure mercury light source, a xenon light source, a light emitting diode, or a laser diode, but the invention is not limited thereto. The light valve is, for example, a reflective liquid crystal on silicon (LCOS), a digital micro-mirror device (DMD), or a transparent liquid crystal panel (TLP), but the invention is not limited thereto.

The heat dissipation fin set 120 of this embodiment may include a plurality of heat dissipation fins F. The first region 121 of the heat dissipation fin set 120 includes a portion of the heat dissipation fins F and the second region 122 of the heat dissipation fin set 120 includes another portion of the heat dissipation fins F. The heat conductors 130 may pass through and connect to each heat dissipation fin F. Specifically, the heat conductors 130 may be provided side-by-side in a first direction from the second ventilation surface S3 to the second ventilation surface S4, wherein the first direction is, for example, substantially parallel to the direction Y. In addition, each heat conductor 130 may extend in a second direction to be connected to the first region 121 and the second region 122, wherein the second direction is, for example, substantially parallel to the direction Z. The heat dissipation fins F are, for example, provided side by side in the second direction (i.e., direction Z) to form a plurality of ventilation gaps. The first ventilation surfaces S1 and S2 may be communicated with each other through the ventilation gaps, and the second ventilation surfaces S3 and S4 may also be communicated with each other through the ventilation gaps.

As shown in FIG. 2, the first fan 140 of this embodiment may be provided beside the first ventilation surface S2. The first fan 140 has an air outlet O1 (shown in FIG. 2) facing the first ventilation surface S2, so that the first airflow F1 can pass through the first region 121 in the direction X. Similarly, the second fan 150 of this embodiment has an air outlet O2 (shown in FIG. 1) facing the second ventilation surface S3, so that the second airflow F2 can pass through the second region 122 in the direction Y. In addition, the projection device 10 of this embodiment may further include a housing 160, in which the heat dissipation module 100 is provided. The housing 160 has a first ventilation hole V1 (shown in FIG. 2) corresponding to the first fan 140 and a second ventilation hole V2 (shown in FIG. 1) corresponding to the second fan 150. For example, the air inlet I1 of the first fan 140 faces the first ventilation hole V1, and the air inlet 12 of the second fan 150 faces the second first ventilation hole V2, but the invention is not limited thereto. In one embodiment, the air outlet O1 of the first fan 140 may face the first ventilation hole V1, and the air inlet I1 may face the first ventilation surface S1 or S2. Similarly, in another embodiment, the air outlet O2 of the second fan 150 may face the second ventilation hole V2, and the air inlet 12 may face the second ventilation surface S3 or S4, but the invention is not limited thereto. Incidentally, the first fan 140 and the second fan 150 of this embodiment each may include, for example, an axial fan, but the invention is not limited thereto. The direction of the first airflow F1 is defined as perpendicular to the air outlet O1 of the first fan 140, and the direction of the second airflow F2 is defined as perpendicular to the air outlet O2 of the second fan 150.

Compared to the prior art, the heat dissipation module 100 of this embodiment uses two fans (i.e., the first fan 140 and the second fan 150) provided at different locations to dissipate heat from the heat dissipation fin set 120, so that the projection device 10 of this embodiment can have better heat dissipation efficiency. In addition, compared to the prior art, the additional fan (e.g., the second fan 150) of the heat dissipation module 100 of this embodiment can be provided in the existing unused space inside the projection device 10, so the housing 160 of the projection device 10 of this embodiment does not require structural changes, thus reducing development costs.

Figure 3:
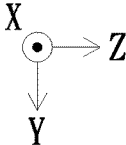
FIG. 3 is a schematic view of a heat dissipation module of a projection device according to another embodiment of the invention.
Figure 4:
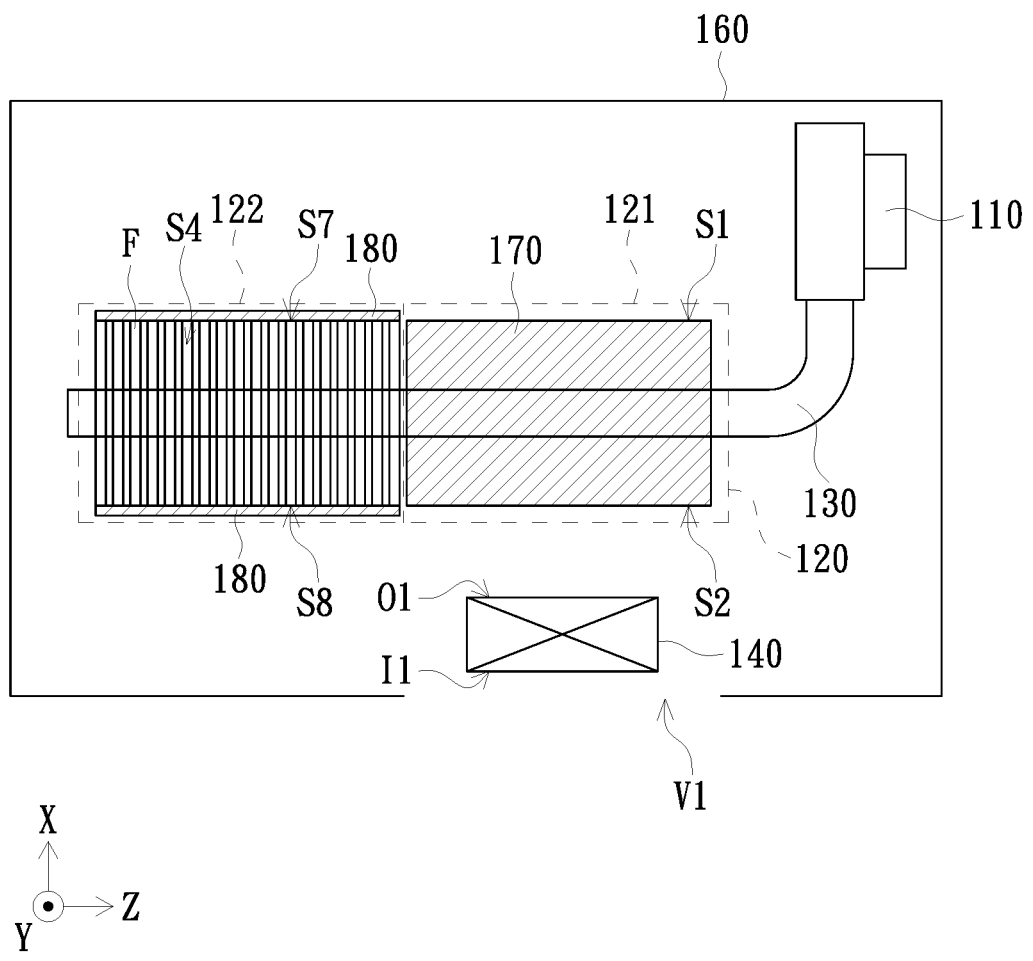
FIG. 4 is a schematic view of the heat dissipation module of the projection device of FIG. 3 from another perspective.

FIG. 3 is a schematic view of a heat dissipation module of a projection device according to another embodiment of the invention. FIG. 4 is a schematic view of the heat dissipation module of the projection device of FIG. 3 from another perspective. The structure and advantages of the projection device 10a of this embodiment are similar to those of the previous embodiment, and only the differences will be described below. Referring to FIGS. 3 and 4, the heat dissipation module 100a further includes, for example, two first air block members 170 and two second air block members 180. The first region 121 further has two third ventilation surfaces S5 and S6 (shown in FIG. 3) opposite each other, wherein the third ventilation surfaces S5 and S6 are respectively connected between the first ventilation surfaces S1 and S2. The first ventilation surfaces S1 and S2 and the third ventilation surfaces S5 and S6 may be communicated with each other through the aforementioned ventilation gaps. In addition, the second region 122 further has two fourth ventilation surfaces S7 and S8 (shown in FIG. 4) opposite each other, wherein the fourth ventilation surfaces S7 and S8 are respectively connected between the second ventilation surfaces S3 and S4. The second ventilation surfaces S3 and S4 and the fourth ventilation surfaces S7 and S8 may be communicated with each other through the aforementioned ventilation gaps. In addition, the two first air block members 170 respectively cover the third ventilation surfaces S5 and S6, so that the airflow can pass through the first region 121 of the heat dissipation fin set 120 more concentratedly. Similarly, the two second air block members 180 respectively cover the fourth ventilation surfaces S7 and S8, so that the airflow can pass through the second region 122 of the heat dissipation fin set 120 more concentratedly. Therefore, the heat dissipation module 100a of this embodiment can further improve the heat dissipation efficiency of the projection device 10a.

Further, because the airflow passing through the first ventilation surfaces S1 and S2 has a more consistent heat dissipation effect on the first region 121 of the heat dissipation fin set 120, the width W1 of each first air block member 170 may be greater than the width W2 of each second air block member 180 in the second direction (i.e., direction Z) to increase the airflow passing through the first ventilation surfaces S1 and S2. However, in one embodiment, the width W1 of the each first air block member 170 may be equal to or less than the width W2 of the second air block member 180, subject to factors such as element configuration. In this embodiment, the material of the first air block member 170 and the second air block member 180 may include polyester resin, copper or aluminum, but the invention is not limited thereto.

Figure 5:
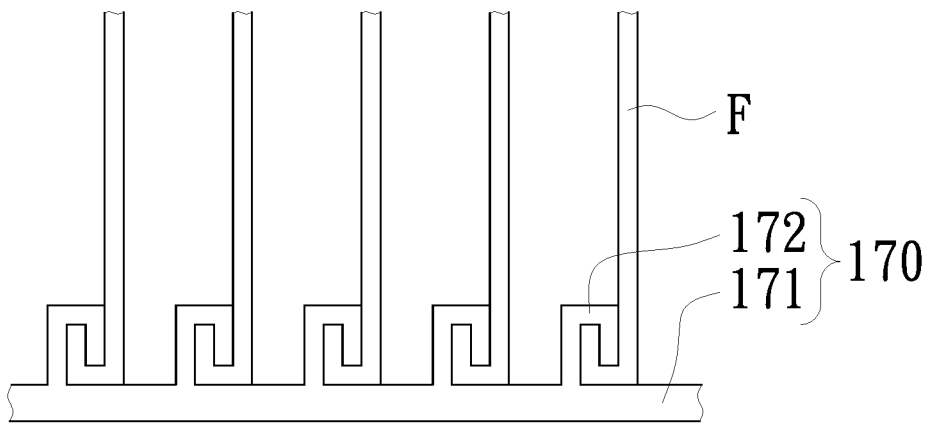
FIG. 5 is a schematic view of the detail structure of the first air block member in FIG. 3.

The heat dissipation fins F of this embodiment may be fixed to the first air block members 170 and the second air block members 180. Referring to FIG. 5, the first air block member 170 and the second air block member 180 each may include a base and a connecting portion. FIG. 5 shows a base 171 and a connecting portion 172 of the first air block member 170 as an example, and the base and the connecting portion of the second air block member 180 are similar to those of the first air block member 170. The connecting portion 172 is located on the base 171, and the base 171 of the first air block member 170 respectively covers the third ventilation surface S5 and S6 (shown in FIG. 3), while the base (not shown) of the second air block member 180 respectively covers the fourth ventilation surface S7 and S8 (shown in FIG. 4). The connecting portion 172 of the first air block member 170 and the connecting portion (not shown) of the second air block member 180 are fixed to the respective heat dissipation fin F. For example, in this embodiment, the connecting portion 172 may include a buckle portion, and one end of the respective heat dissipation fin F may be buckled to the buckle portion of the connecting portion 172, but the invention is not limited thereto. In other embodiments, the first air block members 170 and the second air block members 180 may be attached to the heat dissipation fin set 120 by pasting, welding, or locking, and the invention is not limited thereto.

Figure 6:
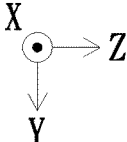
FIG. 6 is a schematic view of a heat dissipation module of a projection device according to another embodiment of the invention.

FIG. 6 is a schematic view of a heat dissipation module of a projection device according to another embodiment of the invention. The structure and advantages of the projection device 10b of this embodiment are similar to those of the previous embodiment, and only the differences will be described below. Referring to FIG. 6, the heat dissipation module 100b may further include a flow guide G1. In this embodiment, the second fan 150 is provided beside the second ventilation surface S3, and the flow guide G1 may be connected between the second fan 150 and the second ventilation surface S3 to increase the airflow passing through the heat dissipation fin set 120, thereby enhancing the heat dissipation efficiency of the heat dissipation module 100b. The flow guide G1 is, for example, a flow guide tube, but the invention is not limited thereto. It is understood that the flow guide G1 may be connected between the second fan 150 and the second ventilation surface S4 when the second fan 150 is provided beside the second ventilation surface S4. Similarly, in one embodiment, the flow guide G1 may be connected between the first fan 140 (shown in FIG. 2) and the first ventilation surface S1 or S2 (the first ventilation surface S2 is shown in FIG. 2). In another embodiment, the flow guide G1 may be provided between the first fan 140 and the first ventilation surface S1 or S2, and also provided between the second fan 150 and the second ventilation surface S3 or S4. Because the above structural changes all can increase the airflow passing through the heat dissipation fin set 120, the invention does not impose any limitation on this. Incidentally, the heat dissipation module 100b of this embodiment can also be provided with the first air block member 170 and the second air block member 180 in FIGS. 3 and 4.

The heat dissipation module 100b of this embodiment may further include, for example, a flow guide G2. The flow guide G2 may be connected between the second fan 150 and the second first ventilation hole V2 to increase the airflow passing through the second fan 150, thereby increasing the heat dissipation efficiency of the heat dissipation module 100b. Similarly, in one embodiment, the flow guide G2 may be connected between the first fan 140 and the first ventilation hole V1 (shown in FIG. 1), or the flow guide G2 may be provided between the first fan 140 and the first ventilation hole V1 and between the second fan 150 and the second ventilation hole V2, and the invention is not limited thereto. It is understood that the shapes of the flow guides G1 and G2 in the figures are only examples, and the invention is not limited thereto.

Figure 7:
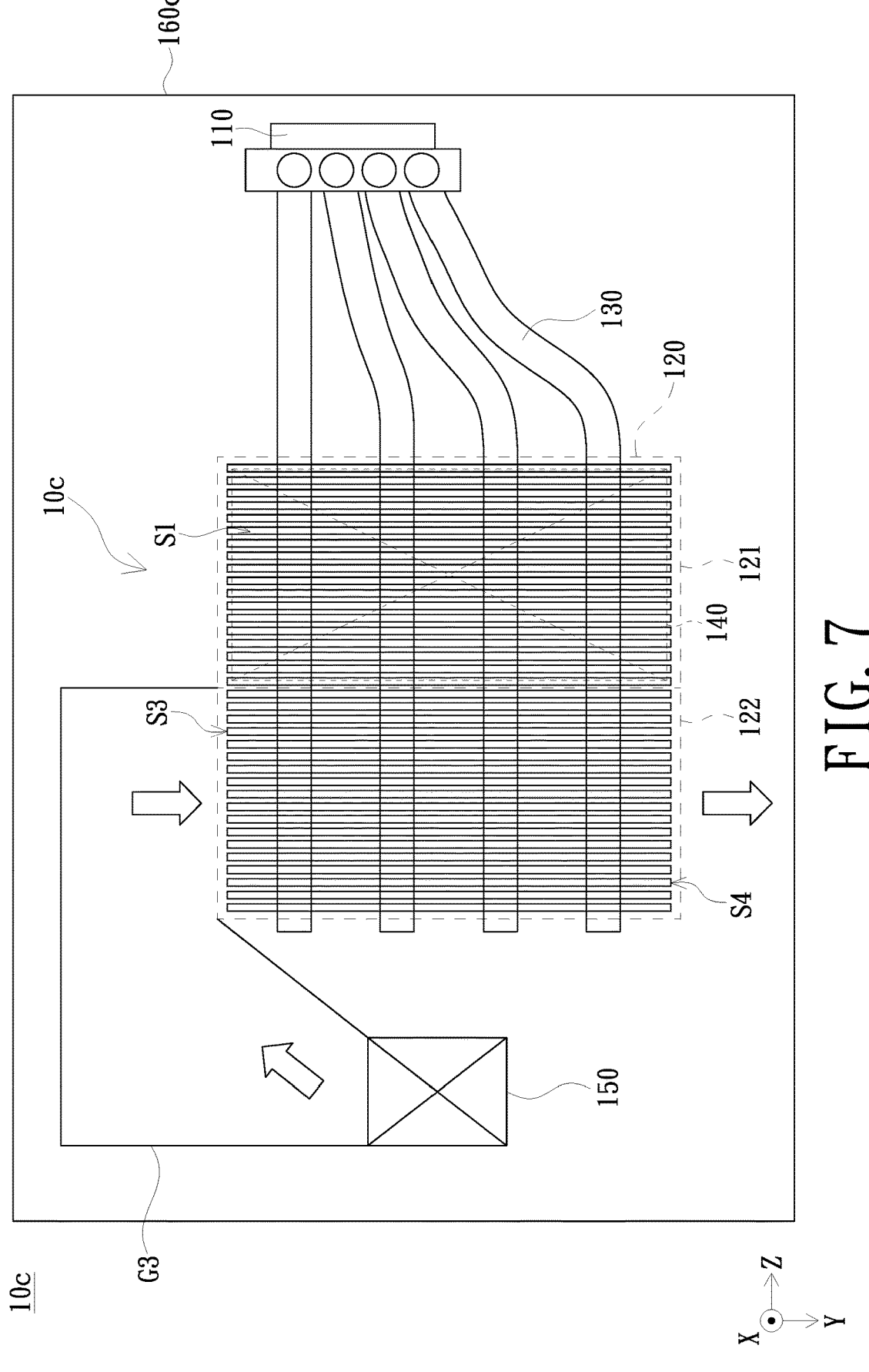
FIG. 7 is a schematic view of a heat dissipation module of a projection device according to another embodiment of the invention.
Figure 8:
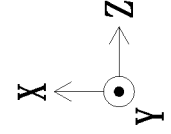
FIG. 8 is a schematic view of the heat dissipation module of the projection device of FIG. 7 from another perspective.

FIG. 7 is a schematic view of a heat dissipation module of a projection device according to another embodiment of the invention. FIG. 8 is a schematic view of the heat dissipation module of the projection device of FIG. 3 from another perspective. The structure and advantages of the projection device 10c of this embodiment are similar to those of the embodiment of FIG. 1, and only the differences will be described below. Referring to FIGS. 7 and 8, the first ventilation hole V3 (shown in FIG. 8) of the housing 160c is positioned approximately the same as that in the embodiment of FIG. 1, while the second ventilation hole V4 (shown in FIG. 8) is positioned differently than that in the embodiment of FIG. 1. The air inlet I1 of the first fan 140 may face the first ventilation hole V3, the air inlet I2 of the second fan 150 may face the second ventilation hole V4, and the air outlet O2 may be connected to the second ventilation surface S3 or S4 by the flow guide G3, wherein FIG. 7 shows the second ventilation surface S3 as an example. In one embodiment, the flow guide G3 may be connected between the first fan 140 and the first ventilation surface S1 or S2, or the flow guide G3 may be provided between the first fan 140 and the first ventilation surface S1 or S2 and provided between the second fan 150 and the and the second ventilation surface S3 or S4. It is understood that the shape of the flow guide G3 in the figures is only an example, and the invention is not limited thereto.

Figure 9:
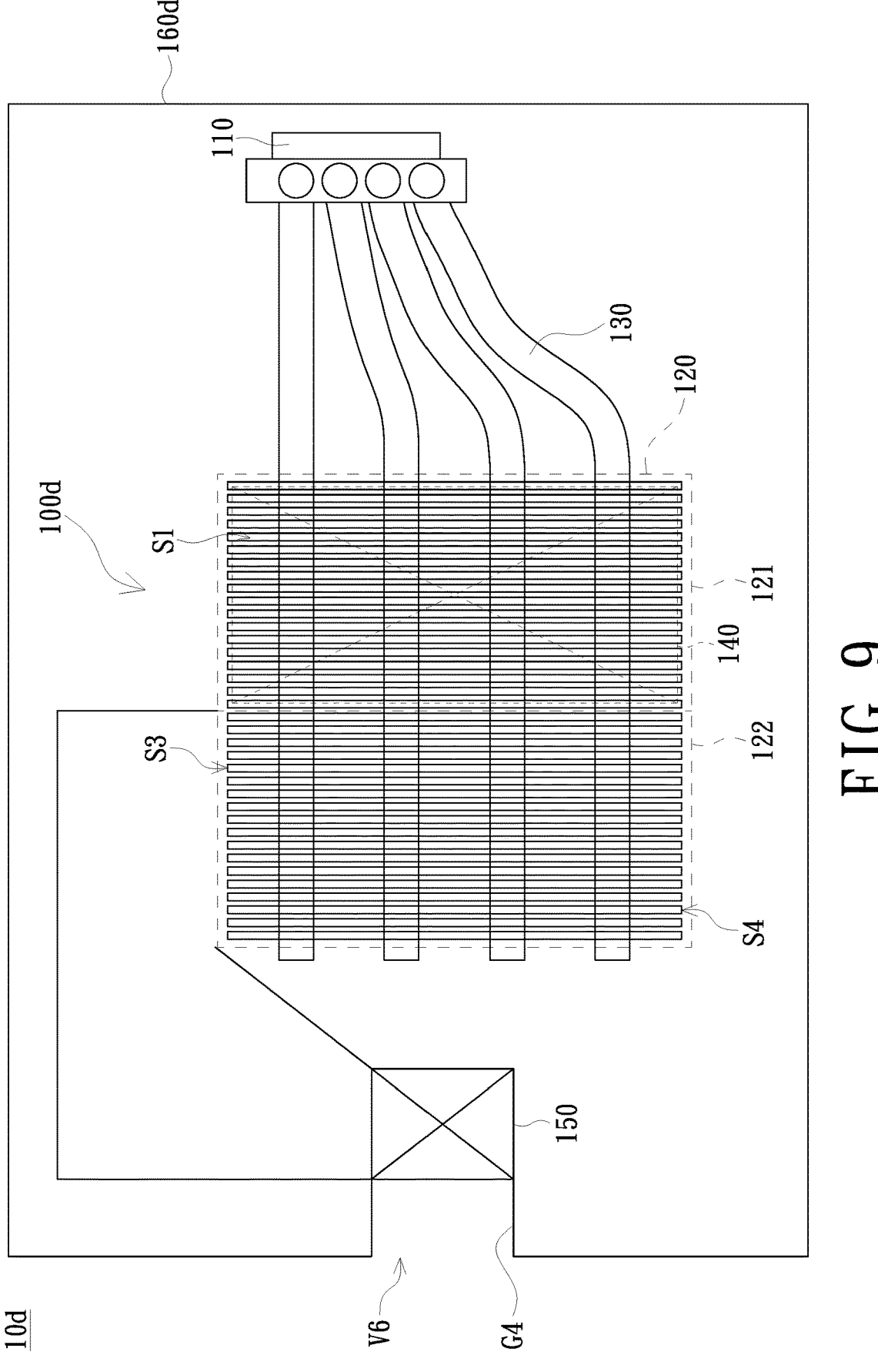
FIG. 9 is a schematic view of a heat dissipation module of a projection device according to another embodiment of the invention.
Figure 10:
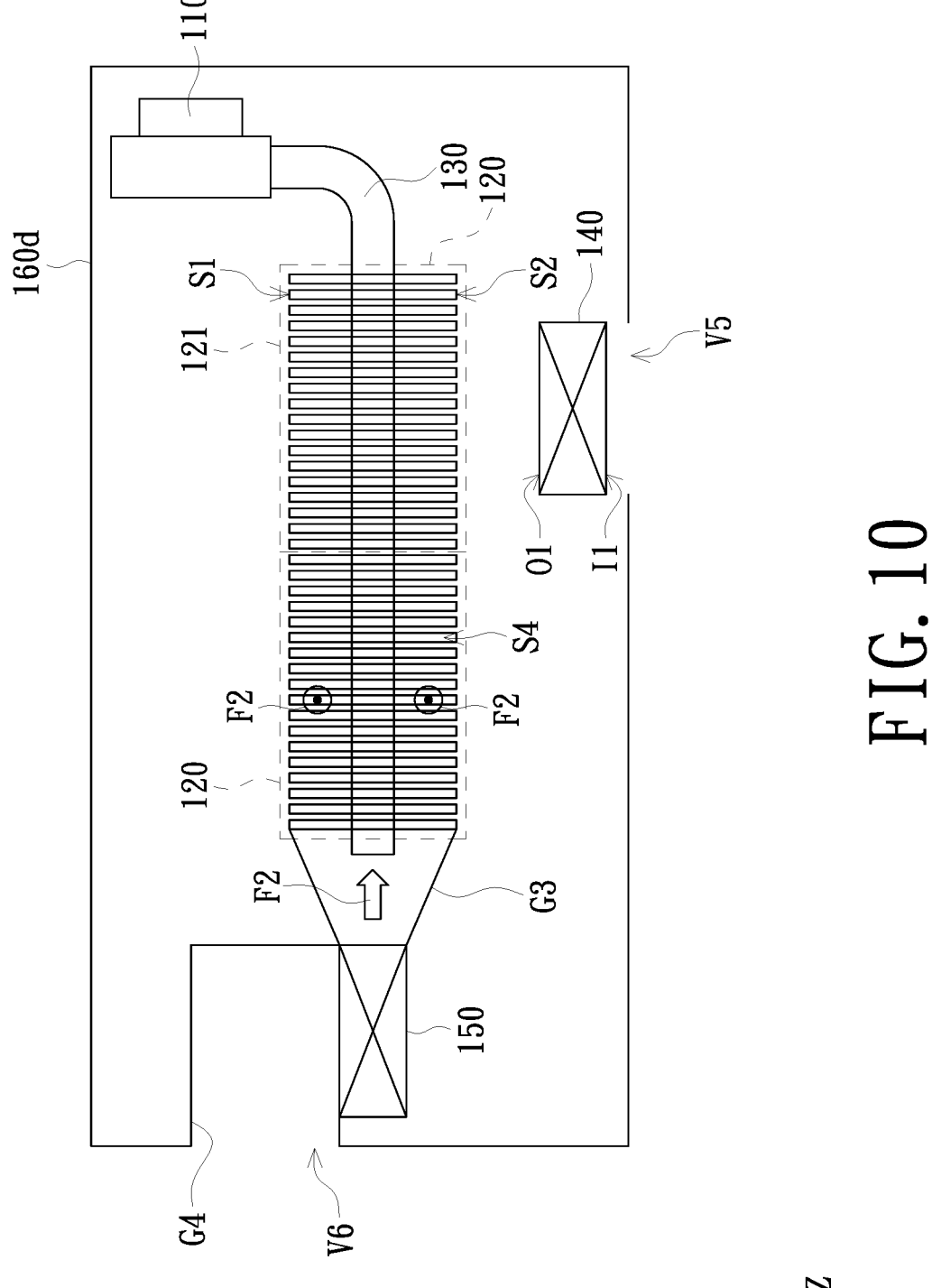
FIG. 10 is a schematic view of the heat dissipation module of the projection device of FIG. 9 from another perspective.

In other embodiments, it is understood that the flow guide may also be provided between the first fan 140 and the first ventilation hole V3 and provided between the second fan 150 and the second ventilation hole V4. FIG. 9 is a schematic view of a heat dissipation module of a projection device according to another embodiment of the invention. FIG. 10 is a schematic view of the heat dissipation module of the projection device of FIG. 9 from another perspective. Referring to the projection device 10d of FIGS. 9 and 10, the second fan 150 and the second ventilation hole V6 may be connected to each other by a flow guide G4. Similarly, the flow guide G4 may be also connected between the first fan 140 and the first ventilation hole V5, or connected between the first fan 140 and the first ventilation hole V5 (shown in FIG. 10) and also between the second fan 150 and the second ventilation hole V6. In this embodiment, the first fan 140 may include a blower fan and the second fan 150 may include an axial fan, but the invention is not limited thereto. It is understood that the shape of the flow guide G4 of this embodiment is only an example, and the invention is not limited thereto.

In summary, in the projection device of the invention, the heat dissipation module uses two fans (i.e., the first fan and the second fan) provided at different locations to dissipate heat from the heat dissipation fin set, so that the projection device of the invention can have better heat dissipation efficiency, compared to the prior art. In addition, compared to the prior art, the additional fan (e.g., the second fan) of the heat dissipation module of the invention can be provided in the existing unused space inside the projection device, so the projection device of the invention does not require structural changes, thus reducing development costs.

The foregoing description of the preferred embodiment of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to best explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "The invention" or the like is not necessary limited the claim scope to a specific embodiment, and the reference to particularly preferred exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. The abstract of the disclosure is provided to comply with the rules requiring an abstract, which will allow a searcher to quickly ascertain the subject matter of the technical disclosure of any patent issued from this disclosure. It is submitted with the understanding that it will not be used to interpret or limit the scope or meaning of the claims. Any advantages and benefits described may not apply to all embodiments of the invention. It should be appreciated that variations may be made in the embodiments described by persons skilled in the art without departing from the scope of the invention as defined by the following claims. Moreover, no element and component in the disclosure is intended to be dedicated to the public regardless of whether the element or component is explicitly recited in the following claims. Furthermore, the terms such as the first region, the second region, the first ventilation surface, the second ventilation surface, the first airflow, the second airflow, the first air block member, the second air block member, the first fan, the second fan, the first ventilation hole and the second ventilation hole are only used for distinguishing various elements and do not limit the number of the elements.

What is claimed is:

1. A projection device, comprising a heat source and a heat dissipation module, and the heat dissipation module comprising a heat dissipation base, a heat dissipation fin set, at least one heat conductor, a first fan and a second fan, wherein:

the heat dissipation base is in contact with the heat source;

the heat dissipation fin set has a first region and a second region adjacent to each other, wherein the first region is located between the heat dissipation base and the second region, the first region has two opposite first ventilation surfaces, the second region has two opposite second ventilation surfaces, and there is an angle between a normal direction of each of the first ventilation surfaces and a normal direction of each of the second ventilation surfaces, and the normal direction of each of the first ventilation surfaces is not parallel to the normal direction of each of the second ventilation surfaces;

the at least one heat conductor is connected between the heat dissipation base and the heat dissipation fin set; and the first fan is configured to generate a first airflow flowing through each of the first ventilation surfaces, the second fan is configured to generate a second airflow flowing through each of the second ventilation surfaces, wherein an air outlet of the first fan faces one of the first ventilation surfaces, and an air outlet of the second fan faces one of the second ventilation surfaces;

wherein a number of the at least one heat conductor is plural, the plurality of heat conductors are provided side by side in a first direction, each of the plurality of heat conductors extends in a second direction to connect to the first region and the second region, and the first direction is perpendicular to the second direction, wherein each of the plurality of heat conductors passes through both of the first region and the second region of the heat dissipation fin set.

2. A projection device, comprising a heat source and a heat dissipation module, and the heat dissipation module comprising a heat dissipation base, a heat dissipation fin set, at least one heat conductor, a first fan and a second fan, wherein:

the heat dissipation base is in contact with the heat source;

the heat dissipation fin set has a first region and a second region adjacent to each other, wherein the first region is located between the heat dissipation base and the second region, the first region has two opposite first ventilation surfaces, the second region has two opposite second ventilation surfaces, and there is an angle between a normal direction of each of the first ventilation surfaces and a normal direction of each of the second ventilation surfaces;

the at least one heat conductor is connected between the heat dissipation base and the heat dissipation fin set;

the first fan is configured to generate a first airflow flowing through each of the first ventilation surfaces; and the second fan is configured to generate a second airflow flowing through each of the second ventilation surfaces;

wherein the heat dissipation module further comprises two first air block members and two second air block members, the first region further has two opposite third ventilation surfaces, each of the two third ventilation surfaces is connected between the two first ventilation surfaces, the second region further has two opposite fourth ventilation surfaces, each of the two fourth ventilation surfaces is connected between the two second ventilation surfaces, the two first air block members respectively cover the two third ventilation surfaces, and the two second air block members respectively cover the two fourth ventilation surfaces.

3. The projection device according to claim 1, wherein the heat dissipation module further comprises two first air block members and two second air block members, the first region further has two opposite third ventilation surfaces, each of the two third ventilation surfaces is connected between the two first ventilation surfaces, the second region further has two opposite fourth ventilation surfaces, each of the two fourth ventilation surfaces is connected between the two second ventilation surfaces, the two first air block members respectively cover the two third ventilation surfaces, and the two second air block members respectively cover the two fourth ventilation surfaces;

wherein each of the first air block members and the second air block members comprises a base and a connecting portion, the connecting portion is located on the respective base, the bases respectively cover the third ventilation surface and the fourth ventilation surface, the heat dissipation fin set comprises a plurality of heat dissipation fins distributed in the first region and the second region, and each of the connecting portions is fixed to the respective heat dissipation fin.

4. The projection device according to claim 1, wherein the heat dissipation module further comprises two first air block members and two second air block members, the first region further has two opposite third ventilation surfaces, each of the two third ventilation surfaces is connected between the two first ventilation surfaces, the second region further has two opposite fourth ventilation surfaces, each of the two fourth ventilation surfaces is connected between the two second ventilation surfaces, the two first air block members respectively cover the two third ventilation surfaces, and the two second air block members respectively cover the two fourth ventilation surfaces;

wherein the first direction is from one of the second ventilation surfaces to the other of the second ventilation surfaces, and a width of each of the first air block members is greater than a width of each of the second air block members in the second direction.

5. A projection device, comprising a heat source and a heat dissipation module, and the heat dissipation module comprising a heat dissipation base, a heat dissipation fin set, at least one heat conductor, a first fan and a second fan, wherein:

the heat dissipation base is in contact with the heat source;

the heat dissipation fin set has a first region and a second region adjacent to each other, wherein the first region is located between the heat dissipation base and the second region, the first region has two opposite first ventilation surfaces, the second region has two opposite second ventilation surfaces, there is an angle between a normal direction of each of the first ventilation surfaces and a normal direction of each of the second ventilation surfaces, and the normal direction of each of the first ventilation surfaces is not parallel to the normal direction of each of the second ventilation surfaces;

the at least one heat conductor is connected between the heat dissipation base and the heat dissipation fin set; and the first fan is configured to generate a first airflow flowing through each of the first ventilation surfaces;

the second fan is configured to generate a second airflow flowing through each of the second ventilation surfaces, wherein an air outlet of the first fan faces one of the first ventilation surfaces, an air outlet of the second fan faces one of the second ventilation surfaces, and the heat dissipation module further comprises a flow guide connected between the air outlet of the second fan and one of the second ventilation surfaces, wherein each of the plurality of heat conductors passes through both of the first region and the second region of the heat dissipation fin set.

6. The projection device according to claim 1, wherein any one of the first fan and the second fan comprises an axial fan or a drum fan.

7. A projection device, comprising a heat source and a heat dissipation module, and the heat dissipation module comprising a heat dissipation base, a heat dissipation fin set, at least one heat conductor, a first fan and a second fan, wherein:

the heat dissipation base is in contact with the heat source;

the heat dissipation fin set has a first region and a second region adjacent to each other, wherein the first region is located between the heat dissipation base and the second region, the first region has two opposite first ventilation surfaces, the second region has two opposite second ventilation surfaces, there is an angle between a normal direction of each of the first ventilation surfaces and a normal direction of each of the second ventilation surfaces, and the normal direction of each of the first ventilation surfaces is not parallel to the normal direction of each of the second ventilation surfaces;

the at least one heat conductor is connected between the heat dissipation base and the heat dissipation fin set;

the first fan is configured to generate a first airflow flowing through each of the first ventilation surfaces;

the second fan is configured to generate a second airflow flowing through each of the second ventilation surfaces, wherein an air outlet of the first fan faces one of the first ventilation surfaces, and an air outlet of the second fan faces one of the second ventilation surfaces, wherein each of the plurality of heat conductors passes through both of the first region and the second region of the heat dissipation fin set, wherein the heat dissipation module further comprises at least one flow guide respectively connected between the first fan and one of the first ventilation surfaces and between the second fan and one of the second ventilation surfaces.

8. The projection device according to claim 1, further comprising a housing, wherein the heat dissipation module is provided in the housing, and the housing has a first ventilation hole corresponding to the first fan and a second ventilation hole corresponding to the second fan.

9. The projection device according to claim 8, wherein the heat dissipation module further comprises at least one flow guide connected between the first fan and the first ventilation hole or connected between the second fan and the second ventilation hole.

10. The projection device according to claim 8, wherein the heat dissipation module further comprises at least one flow guide connected between the first fan and the first ventilation hole and connected between the second fan and the second ventilation hole.

11. The projection device according to claim 1, wherein the angle is between 85 and 95 degrees.

12. The projection device according to claim 1, wherein the heat dissipation fin set comprises a plurality of heat dissipation fins, the first region comprises a first portion of the plurality of heat dissipation fins, and the second region comprises a second portion of the plurality of heat dissipation fins.

* * * * *